United States Patent
Usui et al.

(10) Patent No.: US 7,401,401 B2
(45) Date of Patent: Jul. 22, 2008

(54) MOUNTING HEAD OF ELECTRONIC COMPONENT MOUNTING APPARATUS

(75) Inventors: Yoshinao Usui, Tatebayashi (JP); Haruhiko Yamaguchi, Ota (JP); Ikuo Takemura, Gunma (JP); Manabu Okamoto, Isesaki (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 50 days.

(21) Appl. No.: 11/261,940

(22) Filed: Oct. 31, 2005

(65) Prior Publication Data

US 2006/0103151 A1     May 18, 2006

(30) Foreign Application Priority Data

Oct. 29, 2004   (JP)   ............. 2004-316495

(51) Int. Cl.
*H05K 13/04* (2006.01)
(52) U.S. Cl. ............... 29/743; 29/739; 414/737
(58) Field of Classification Search ........... 29/739, 29/740, 741, 742, 743, 744, 832, 833, 750, 29/721, DIG. 44; 294/64.1; 347/29, 30; 414/737

See application file for complete search history.

(56) References Cited

U.S. PATENT DOCUMENTS 6,260,898 B1 *   7/2001   Kano et al. ............... 294/64.1

FOREIGN PATENT DOCUMENTS

EP           1079678 A2 *   2/2001
JP           2001-053492    2/2001

\* cited by examiner

*Primary Examiner*—A. Dexter Tugbang
*Assistant Examiner*—Livius R Cazan
(74) *Attorney, Agent, or Firm*—Morrison & Foerster LLP

(57) ABSTRACT

The invention is directed to reduction of torque by reduction of an outside diameter of a mounting head. A cylindrical cam rotation motor is provided under a nozzle rotation motor. A first rotation axis member as a rotor of the nozzle rotation motor is provided along an axis line of a nozzle holder and penetrates into the nozzle rotation motor and the cylindrical cam rotation motor. A second rotation axis member as a rotor of the cylindrical cam rotation motor is provided along an axis line of a cylindrical cam member and penetrates into the cylindrical cam rotation motor. A suction nozzle to be used protrudes from a lower end surface of the nozzle holder at a protrusion position.

11 Claims, 5 Drawing Sheets

MOUNTING HEAD OF ELECTRONIC COMPONENT MOUNTING APPARATUS

CROSS-REFERENCE OF THE INVENTION

This invention is based on Japanese Patent Application No. 2004-316495, the content of which is incorporated by reference in its entirety.

BACKGROUND OF THE INVENTION

1. Field of the Invention

The invention relates to a mounting head of an electronic component mounting apparatus for mounting a picked electronic component on a board.

2. Description of the Related Art

A mounting head of an electronic component mounting apparatus in which a suction nozzle has a long life without affecting its operation, i.e., not having to change a suction nozzle is described in Japanese Patent Application Publication No. 2001-53492.

However, although a nozzle selection motor for selecting any one from a plurality of suction nozzles provided on the mounting head, and a cam rotation motor for rotating the suction nozzle by θ angle are disposed on the upper and lower sides, since stators (electromagnet) of the motors are set on an outer circumference of a nozzle holder mounted with a plurality of suction nozzles capable of protruding and retracting, an outside diameter of the mounting head is large, thereby requiring a large amount of torque.

SUMMARY OF THE INVENTION

The invention provides a mounting head of an electronic component mounting apparatus. The mounting heads includes a nozzle holder housing two or more suction nozzles that are configured to move vertically with respect to the nozzle holder. Each of the suction nozzles has a cam follower provided at its upper portion. The mounting head also includes a first rotation drive motor rotating the nozzle holder around a first rotation axis member in a normal direction and a reverse direction, and a cylindrical cam member having a contact surface that is in contact with the cam followers of the suction nozzles. The contact surface of the cylindrical cam member is configured to provide at least two vertical positions in which the suction nozzles rest stably. The mounting head further includes a second rotation drive motor rotating the cylindrical cam member around a second rotation axis member in the normal and reverse directions. The first and second rotation axis members are configured to be coaxial so that a common axis of the first and second rotation axis members passes through the nozzle holder and the cylindrical cam member.

DETAILED DESCRIPTION OF THE INVENTION

Figure 1:
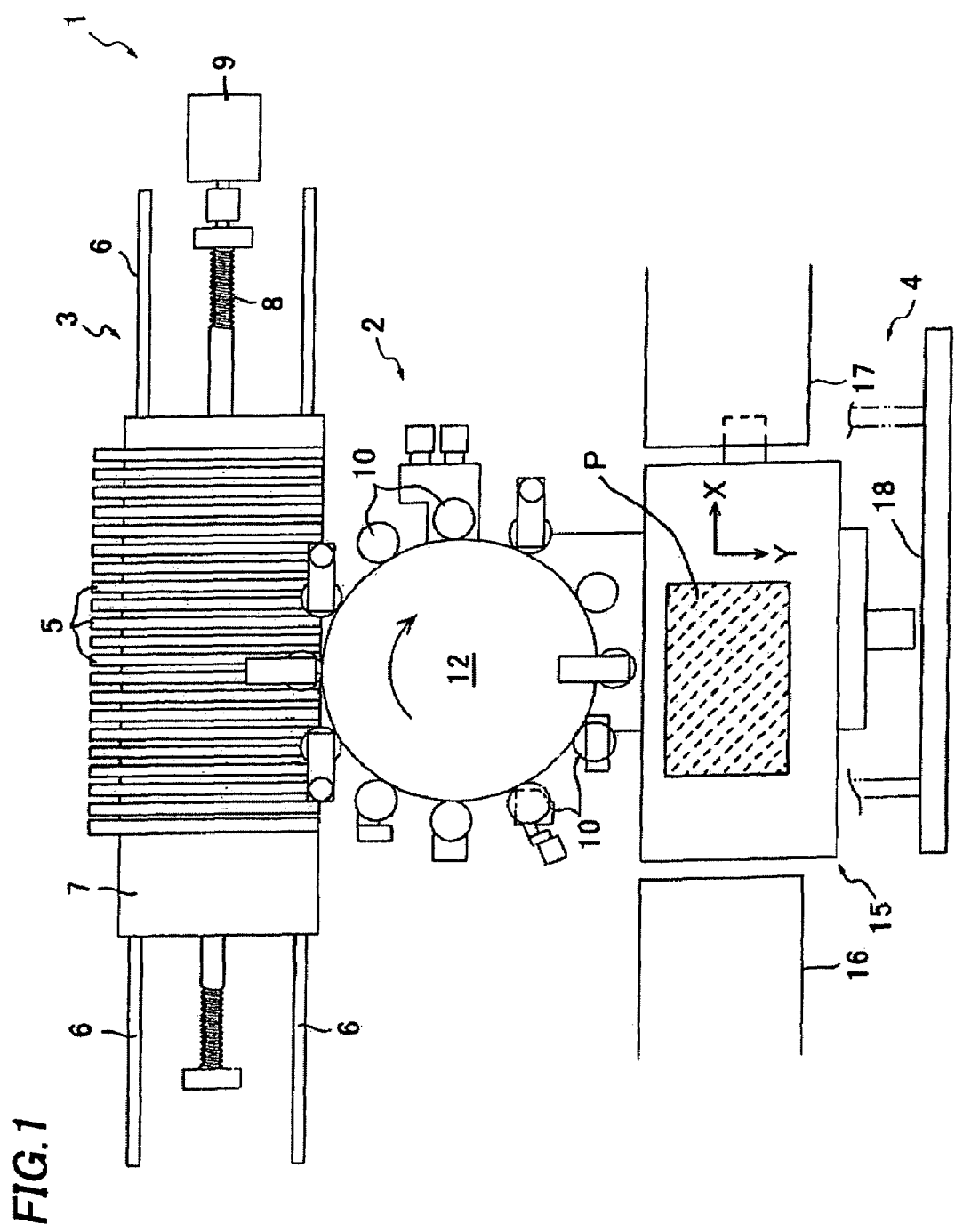
FIG. 1 is a plan view of an electronic component mounting apparatus.
Figure 2:
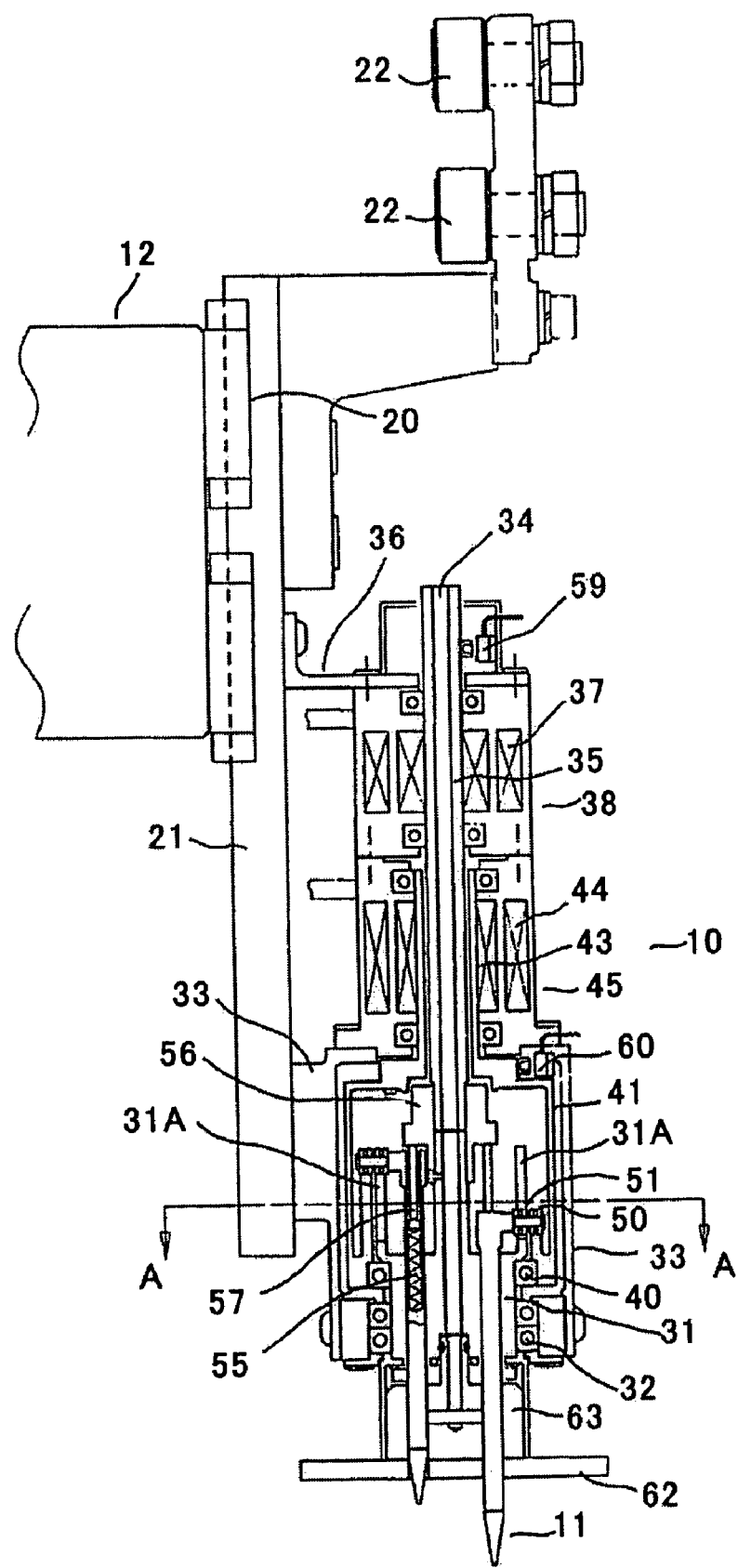
FIG. 2 is a vertical cross-sectional view of a mounting head.
Figure 3:
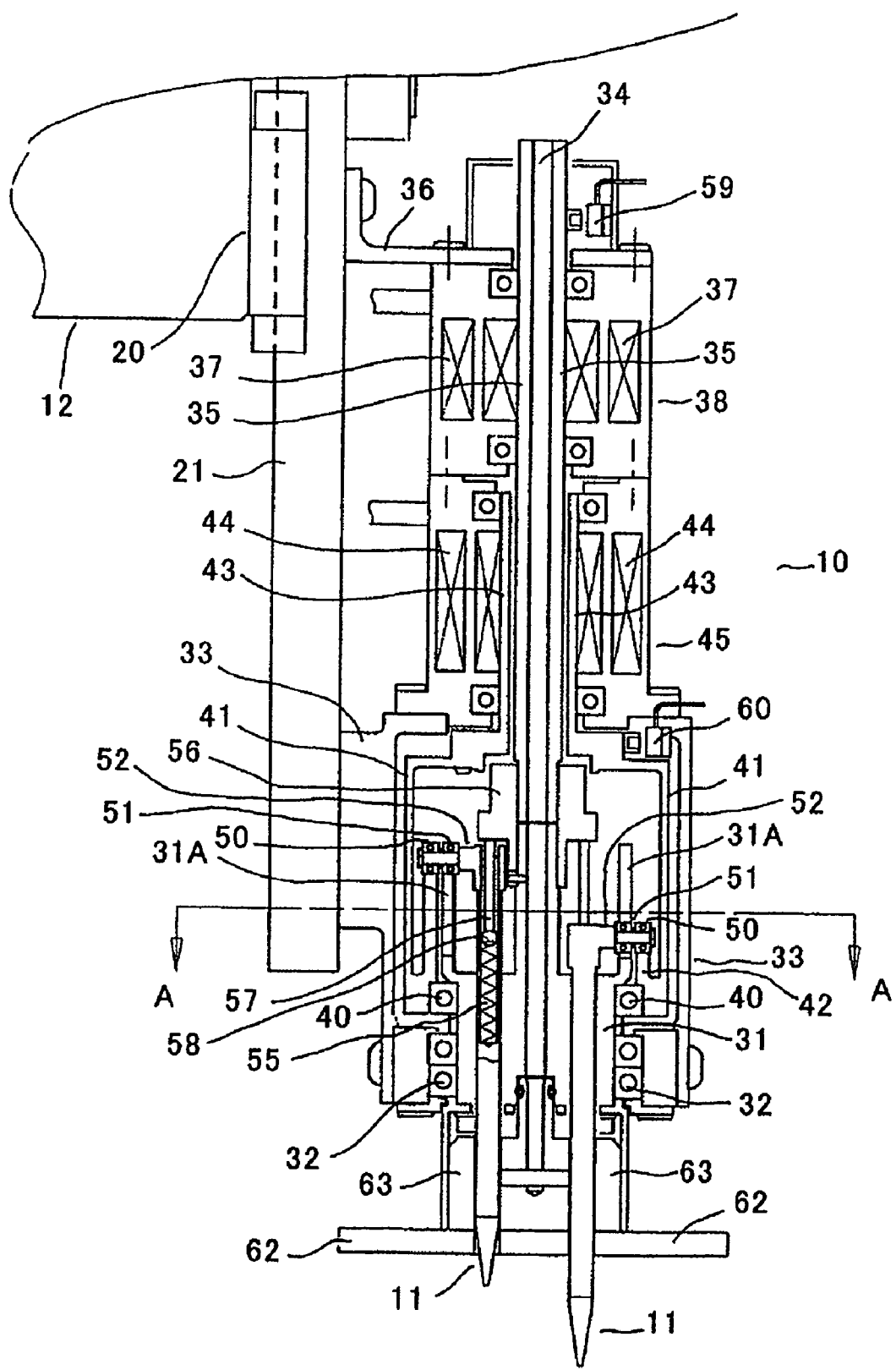
FIG. 3 is a partially enlarged vertical cross-sectional view of the mounting head.
Figure 4:
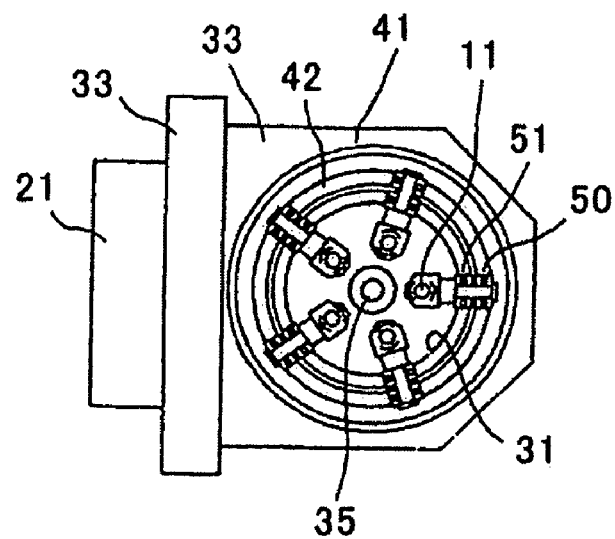
FIG. 4 is a cross-sectional view along line A-A of FIG. 3.

An electronic component mounting apparatus having a mounting head of an embodiment of the invention will be described with reference to figures. FIG. 1 is a plan view of an electronic component mounting apparatus 1. This electronic component mounting apparatus 1 includes a feeding system 3 for feeding electronic components and a mounting system 4 for mounting the electronic components on a printed board P, which are disposed in parallel with each other with an apparatus body 2 interposed therebetween. The apparatus body 2 has an index unit as a main body of a drive system, a rotation table 12 connected to the index unit, and a plurality (for example, twelve) of mounting heads 10 mounted on an outer circumference of the rotation table 12. The rotation table 12 intermittently rotates by predetermined pitches corresponding to the number of the mounting heads 10, driven by the index unit. By the intermittent rotation of the rotation table 12, any one of the suction nozzles 11 mounted on each of the mounting heads 10 moves to the feeding system 3 or the mounting system 4 as appropriate. That is, the suction nozzle 11 mounted on the mounting head 10 moves to the feeding system 3 in order to pick up the electronic component fed by the feeding system 3, and then moves by rotating to the mounting system 4 in order to mount the electronic component on the printed board P conveyed to the mounting system 4.

The feeding system 3 includes component feeding units 5 of which the number corresponds to the number of types of the electronic components to be mounted on the printed board P. The component feeding units 5 are detachably attached to a feeding stage 7 slidably guided by a pair of guide rails 6, being aligned in a lateral direction. A ball screw 8 is screwed in the feeding stage 7 in its sliding direction, and normal and reverse rotation of a convey motor 9 connected with one end of the ball screw 8 makes the feeding stage 7 move forward and backward to selectively move the required component feeding unit 5 to a position where the mounting head 10 picks up the component. Each of the component feeding units 5 has a carrier tape storing the electronic components therein at predetermined pitches, the carrier tape being wound around a tape reel. Each of the electronic components is sequentially picked up by the suction nozzle 11 from the carrier tape let out from the tale reel.

The mounting system 4 includes a XY table 15 for moving the printed board P set thereon in X-axis and Y-axis directions, a feeding conveyer 16 and a discharging conveyer 17 provided on front and rear sides of the XY table 15, and a board conveying device 18 for simultaneously conveying the printed board P set on the feeding conveyer 16 to the XY table 15 and the printed board P set on the XY table 15 to the discharging conveyer 17.

The printed board P conveyed to a downstream end of the feeding conveyer 16 is conveyed onto the XY table 15 by the board conveying device 18, and simultaneously the printed board P on the XY table 15, which is completed with component mounting, is conveyed to the discharging conveyer 17 by this board conveying device 18. The printed board P conveyed onto the XY table 15 is moved in planar directions by the XY table 15 as appropriate, so that its component mounting position is positioned at a mounting position corresponding to each of electronic components sequentially carried by each of the mounting heads 10, and each of the suction nozzles 11 mounts the electronic component on that position on the printed board P.

The apparatus body 2 has the index unit as the main body of the drive system on a support, and the index unit intermittently rotates the rotation table 12, and activates various devices of the apparatus body 2, synchronizing (linking) the devices with the intermittent cycle of the rotation table 12.

The rotation table 12 is fixed to an axis cylinder (not shown) which rotates by the index unit and intermittently rotates clockwise. The twelve mounting heads 10 are attached on the outer circumference of the rotation table 12, being disposed at same intervals in a circumference direction along the linear blocks 20 and vertically movable through linear rails 21. Then, two cam followers 22 rotate, rounding an upper portion of the axis cylinder and being pressed to upper and lower surfaces of a cam formed on almost all the lower end circumference edge portion of a hollow and cylindrical cylindrical cam member for guiding the rotation table 12. Each of the mounting heads 10 rotates together with the rotation table 12 along the shape of the cam, vertically moving along each of the linear blocks 20 as described above.

In this case, the number of the intermittent rotations of the rotation table 12 is twelve for completing one cycle, corresponding to the number of the mounting heads 13, and the mounting heads 10 rotated by each intermittent rotation of the rotation table 12 stop at twelve stop positions respectively. The twelve stop positions includes a pickup position for picking up an electronic component, a mounting position for mounting an electronic component, a position for taking an image of a picked electronic component and aligning the posture of the component, and a position for changing the suction nozzle of the mounting head 10, and so on.

Next, the mounting head 10 will be described with reference to FIGS. 2 to 7. Each of the mounting heads 10 supports five (for example) suction nozzles 11 disposed at same intervals in its circumference direction, being capable of protruding and retracting each of the suction nozzles 11, and includes a nozzle holder 31 having five nozzle vertical movement grooves 31 A each for guiding the suction nozzle 11 for its vertical protruding and retracting movement, a holder support member 33 fixed to the linear rail 21 and rotatably supporting the nozzle holder 31 through a rotor bearing 32, and a hollow and cylindrical first rotation axis member 35 of which a lower end is fixed to an upper portion of the nozzle holder 31, an upper portion is rotatably supported by a support member 36 fixed to the linear rail 21, and a center is formed with a vacuum path 34. Furthermore, a nozzle rotation motor (a first rotation drive motor, for example, a stepping motor) 38 having the first rotation axis member 35 fixed to the nozzle holder 31 as a rotor and a stator 37 of an electromagnet where this first rotation axis member 35 is rotatably penetrated is fixed to a lower surface of the support member 36, being rotatable in normal and reverse directions. Therefore, driving this nozzle rotation motor 38 makes the nozzle holder 31 rotate against the holder support member 33 through the rotor bearing 32. That is, the plurality of suction nozzles 11 rotates around an axis of the nozzle holder 31.

Furthermore, a cylindrical cam member 41 is provided between the upper portion of the nozzle holder 31 and the holder support member 33, being rotatable through a cylindrical cam bearing 40. A low cylindrical cam 42 is formed standing all around an inner and lower portion of this cylindrical cam member 41, and a second rotation axis member 43 is connected to an upper portion of the cylindrical cam member 41, being rotatable around the first rotation axis member 35. That is, the first rotation axis member 35 is rotatably formed in a hollow portion of the second rotation axis member 43. Furthermore, a cylindrical cam rotation motor (a second rotation drive motor, for example, a stepping motor) 45 having the second rotation axis member 43 as a rotor and a stator 44 of an electromagnet where this second rotation axis member 43 is rotatably penetrated is fixed to a lower surface of the nozzle rotation motor 38, being rotatable in normal and reverse directions. Therefore, driving this cylindrical cam rotation motor 45 makes the cylindrical cam member 41 rotate through the cylindrical cam bearing 40. That is, driving this cylindrical cam rotation motor 45 makes the cylindrical cam member 41 rotate around the axis of the nozzle holder 31.

A support member 52 for rotatably supporting a first cam follower 50 for controlling a height of the suction nozzle 11 and a second cam follower 51 for preventing the suction nozzle 11 rotating is provided on the upper portion of each of the suction nozzles 11, extending to the outside of the nozzle holder 31. That is, the first cam follower 50 and the second cam follower 51 are rotatably provided around a thin portion of this support member 52. This first cam follower 50 rotates on an upper surface of the cylindrical cam 42 of the cylindrical cam member 41, and the second cam follower 51 is settable on a groove formation bottom surface of a nozzle vertical movement groove 31 A of the nozzle holder 31. These first cam follower 50 and second cam follower 51 are formed of bearings.

Figure 5:
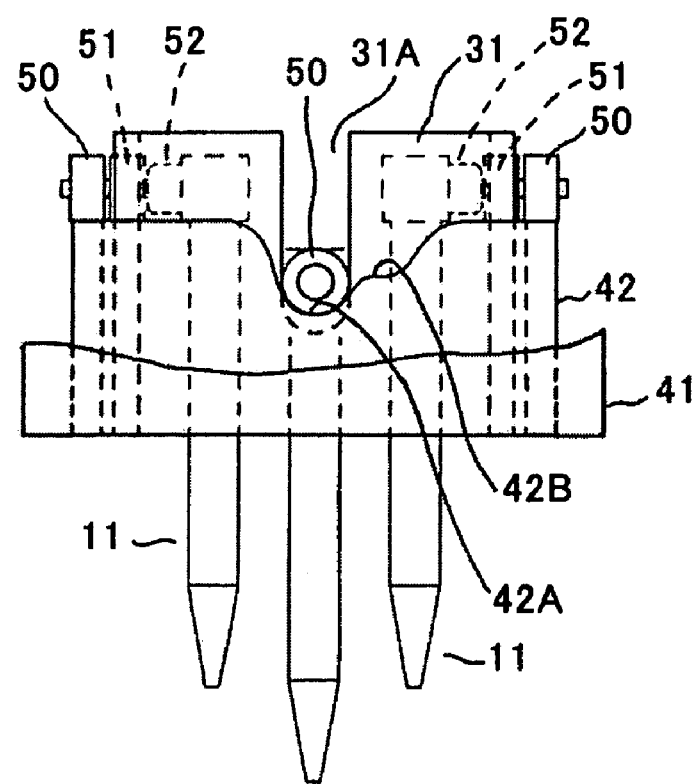
FIG. 5 is a side view partially omitted showing a cylindrical cam member (cylindrical cam) and a nozzle holder.
Figure 6:
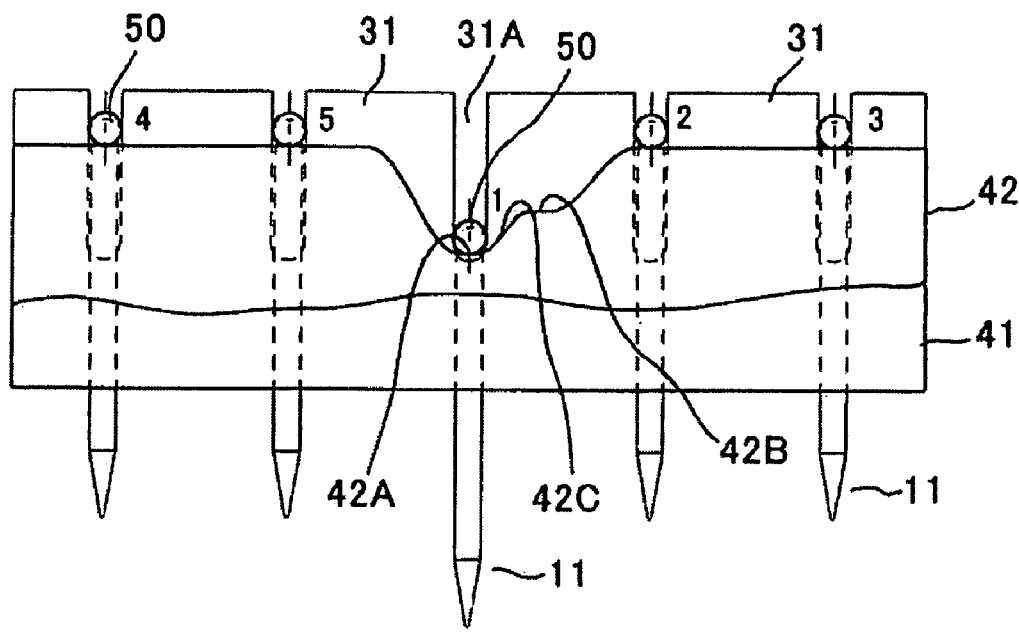
FIG. 6 is an explanatory development view of the cylindrical cam and the nozzle holder when a lower end level of a suction nozzle is at a low level position.
Figure 7:
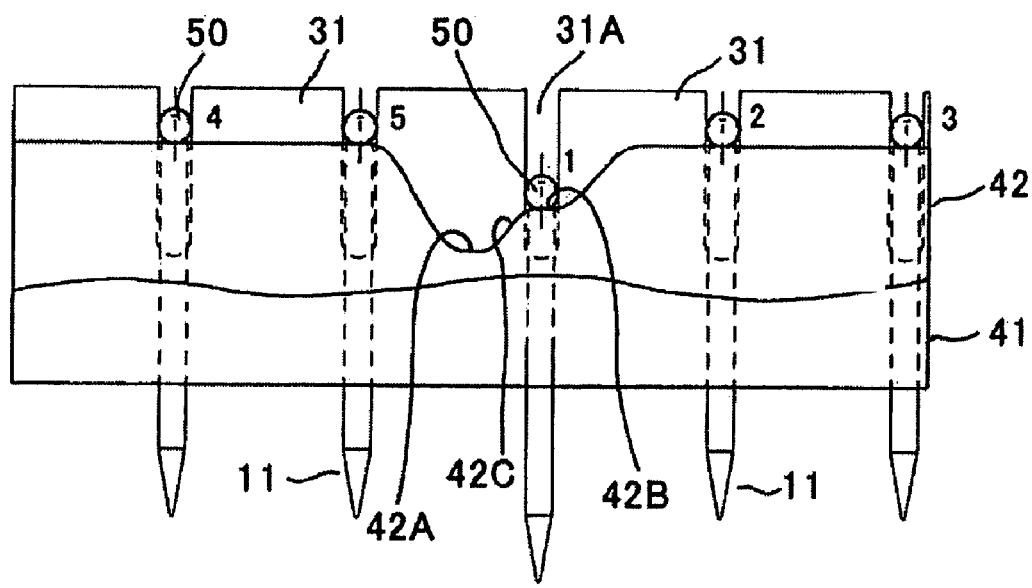
FIG. 7 is an explanatory development view of the cylindrical cam and the nozzle holder when the lower end level of the suction nozzle is at a high level position.

As shown in FIGS. 5 to 7, a cam surface is formed on an upper end surface of the cylindrical cam 42 of the cylindrical cam member 41, and first and second protrusion cam surfaces 42A and 42B for descending and protruding the suction nozzle 11 are formed in a part of this cam surface. A compression spring 55 is inserted into the suction nozzle 11, with its lower end portion supported, and pressed by six depression pins 57 and a ball 58 fixed to a lower end of a coupling 56 to press the suction nozzle 11 downward. Therefore, the first cam follower 50 rotates, being pressed to contact with an upper surface of the cylindrical cam 42 of the cylindrical cam member 41.

When the suction nozzle 11 to be used is selected and the first cam follower 50 is positioned on the protrusion cam surface 42A, a lower end level of the suction nozzle 11 is at a low level position, and when positioned on the protrusion cam surface 42B, the lower end level is at a high level position. When the first cam follower 50 is positioned on a protrusion cam surface 42C continued to both the surfaces 42A and 42B, the lower end level of the suction nozzle 11 is at a middle level position between both the low and high level positions. Therefore, it is possible to align a height level position of the suction nozzle 11, corresponding to a thickness of the electronic component when mounted on the printed board P on the XY table 15.

The mounting head 10 includes a nozzle position detection encoder (position detection means) 59 for detecting a rotation angle position of the nozzle holder 31 and a cam position detection encoder (position detection means) 60 for detecting a rotation angle position of the cylindrical cam member 41. Both the encoders 59 and 60 are connected with a CPU (control means) of a microcomputer, and the CPU is connected with the nozzle rotation motor 38 and the cylindrical cam rotation motor 45 through motor drivers (control means), respectively, to control the motors.

When a component recognition camera takes an image of an electronic component held by the suction nozzle 11 by suction, an attachment member 63 attached with a diffusion board 62 for applying diffused light to the electronic component is fixed to a lower portion of the nozzle holder 31.

Hereafter, an operation of protruding any one of the suction nozzles 11 (an operation of selecting the suction nozzle 11 to be used) will be described. First, a normal or positive rotational direction and the number of steps are determined and the nozzle rotation motor 38 is driven by control of the CPU based on a detection result of the nozzle position detection encoder 59. Then, for positioning the lower end level of the suction nozzle 11 to be used at the low level position, the nozzle holder 31 is rotated to position the first cam follower 50 of the suction nozzle 11 on the protrusion cam surface 42A, so that the suction nozzle 11 to be used moves to the position of the protrusion cam surface 42A, that is, the protrusion position where the suction nozzle 11 to be used descends lower than the other suction nozzles 11 (FIGS. 5 and 6). That is, when the suction nozzle 11 to be used is moved and positioned at the protrusion cam surface 42A, the suction nozzle 11 descends by a cam effect of the protrusion cam surface 42A and its tip portion protrudes from the lower end surface of the nozzle holder 31. The suction nozzle 11 to be used is thus selected.

For positioning the suction nozzle 11 at an angle for mounting the component on the printed board P based on mounting data about a mounting position or an angle for mounting stored in a memory (not shown), a normal or reverse rotational direction and the number of steps are determined, and the nozzle rotation motor 38 and the cylindrical cam rotation motor 45 are driven to the same direction, being synchronized with each other, to rotate the nozzle holder 31 and the cylindrical cam member 41 together, by control of the CPU based on the detection result of the nozzle position detection encoder 59 and the cam position detection encoder 60. As a result, the suction nozzle 11 to be used rotates by θ angle, so that the electronic component can be mounted on the printed board P at a required mounting angle.

It is possible to raise or descend the electronic component by a small amount by using the cylindrical cam 42 of the cylindrical cam member 41, for example, when the electronic component is picked up from the component feeding unit 5 or the electronic component is mounted on the printed board P. When the first cam follower 50 is positioned on the protrusion cam surface 42A, the lower end level of the suction nozzle 11 is at the low level position, and when positioned on the protrusion cam surface 42B, the lower end is at the high level position. When the first cam follower 50 is positioned on the protrusion cam surface 42C continued to both the surfaces 42A and 42B, the lower end level is at the middle level position between the low and high level positions. Accordingly, the height level position of the suction nozzle 11 can be adjusted according to the upper surface level of the electronic component so as to pick up the electronic component from the component feeding unit 5, and according to a thickness of the electronic component so as to mount an electronic component on the printed board P on the XY table 15.

As described above, in the embodiment, the nozzle rotation motor 38 and the cylindrical cam rotation motor 45 can make the cylindrical cam member 41 (cylindrical cam 42) and the nozzle holder 31 rotate in a normal or reverse direction to predetermined positions fast respectively, and only the required suction nozzle 11 protrude at a required protrusion position. That is, the suction nozzle 11 to be used can be protruded to an appropriate position accurately and fast at the stop position of the rotation table 12 intermittently rotating or even during the rotation table 12 is intermittently rotating. Furthermore, conventionally, since magnets of motors are disposed on the outside of a nozzle holder mounted with a plurality of suction nozzles capable of protruding and retracting, an outside diameter of a mounting head is large and a large amount of torque is required. However, in the embodiment, the outside diameter of the mounting head is reduced and required torque is small.

Although the nozzle rotation motor 38 and the cylindrical cam rotation motor 45 are formed of stepping motors in this embodiment, these can be formed of servomotors. In this case, encoders set in these servomotors have the same functions as the nozzle position detection encoder 59 and the cam position detection encoder 60, so that it is possible to omit these encoders 59 and 60.

Although particular preferred embodiment of the invention has been disclosed in detail, it will be recognized that variations or modifications of the invention are possible based on the disclosure and lie within the scope of the invention.

What is claimed is:

1. A mounting head of an electronic component mounting apparatus, comprising:
   a nozzle holder housing two or more suction nozzles that are configured to move vertically with respect to the nozzle holder, each of the suction nozzles comprising a cam follower provided at an upper portion thereof;
   a first rotation drive motor rotating a first rotation axis member in a normal direction and a reverse direction, the nozzle holder being fixed to the first rotation axis member and positioned around the first rotation axis member;
   a cylindrical cam member comprising a contact surface that is in contact with the cam followers of the suction nozzles, the contact surface of the cylindrical cam member being configured to provide at least two vertical positions in which the suction nozzles rest stably; and
   a second rotation drive motor rotating a second rotation axis member in the normal and reverse directions, the cylindrical cam member being fixed to the second rotation axis member and positioned around the second rotation axis member,
   wherein the first and second rotation axis members are configured to operate as rotors of corresponding rotation drive motors and to be coaxial so that a common axis of the first and second rotation axis members passes through the nozzle holder and the cylindrical cam member.

2. The mounting head of claim 1, wherein one of the first and second rotation drive motors is disposed above another of the first and second rotation drive motors along the common axis.

3. The mounting head of claim 1, wherein the second rotation axis member has a hollow portion and the first rotation axis member is rotatably placed in the hollow portion.

4. The mounting head of claim 1, wherein each of the first and second rotation drive motors comprises a stepping motor.

5. The mounting head of claim 1, wherein the contact surface of the cylindrical cam member is configured to provide at least three vertical positions in which the suction nozzles rest stably.

6. The mounting head of claim 1, wherein the first rotation drive motor and the second rotation drive motor are disposed above the nozzle holder.

7. A mounting head of an electronic component mounting apparatus, comprising:
   a nozzle holder housing two or more suction nozzles that are configured to move vertically with respect to the nozzle holder, each of the suction nozzles comprising a cam follower provided at an upper portion thereof;
   a first rotation drive motor rotating a first rotation axis member in a normal direction and a reverse direction, the nozzle holder being fixed to the first rotation axis member and positioned around the first rotation axis member;

a cylindrical cam member comprising a contact surface that is in contact with the cam followers of the suction nozzles, the contact surface of the cylindrical cam member being configured to provide at least two vertical positions in which the suction nozzles rest stably; and a second rotation drive motor disposed under the first rotation drive motor and rotating a second rotation axis member in the normal and reverse directions, the cylindrical cam member being fixed to the second rotation axis member and positioned around the second rotation axis member, wherein the first and second rotation axis members are configured to operate as rotors of corresponding rotation drive motors and to be coaxial so that a common axis of the first and second rotation axis members passes through the nozzle holder and the cylindrical cam member.

8. The mounting head of claim 7, wherein the second rotation axis member has a hollow portion and the first rotation axis member is rotatably placed in the hollow portion.

9. The mounting head of claim 7, wherein each of the first and second rotation drive motors comprises a stepping motor.

10. The mounting head of claim 7, wherein the contact surface of the cylindrical cam member is configured to provide at least three vertical positions in which the suction nozzles rest stably.

11. The mounting head of claim 7, wherein the first rotation drive motor and the second rotation drive motor are disposed above the nozzle holder.

* * * * *